US012334393B2

United States Patent
Yang

(10) Patent No.: US 12,334,393 B2
(45) Date of Patent: Jun. 17, 2025

(54) SEMICONDUCTOR STRUCTURE AND METHOD OF MAKING THE SAME

(71) Applicant: ChangXin Memory Technologies, Inc., Hefei (CN)

(72) Inventor: Jian Yang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/915,989

(22) PCT Filed: Jun. 30, 2022

(86) PCT No.: PCT/CN2022/102632
§ 371 (c)(1),
(2) Date: Sep. 29, 2022

(87) PCT Pub. No.: WO2023/245712
PCT Pub. Date: Dec. 28, 2023

(65) Prior Publication Data
US 2024/0234202 A1 Jul. 11, 2024

(30) Foreign Application Priority Data
Jun. 24, 2022 (CN) .......................... 202210726492.7

(51) Int. Cl.
*H10D 62/10* (2025.01)
*H01L 21/02* (2006.01)
(Continued)

(52) U.S. Cl.
CPC .... *H01L 21/76831* (2013.01); *H01L 21/0223* (2013.01); *H01L 21/76237* (2013.01);
(Continued)

(58) Field of Classification Search
CPC ......... H01L 21/76202; H01L 21/76205; H01L 21/76227; H01L 21/76237; H01L 21/0223;
(Continued)

(56) References Cited

U.S. PATENT DOCUMENTS 11,056,576 B1 * 7/2021 Huang ................. H10D 64/027

FOREIGN PATENT DOCUMENTS

| CN | 105448802 A | 3/2016 |
|---|---|---|
| CN | 108511518 A | 9/2018 |

(Continued)

OTHER PUBLICATIONS

PCT/CN2022/102632 International Search Report mailed Mar. 8, 2023.

*Primary Examiner* — Thanhha S Pham
(74) *Attorney, Agent, or Firm* — Kilpatrick Townsend & Stockton LLP

(57) ABSTRACT

The disclosed method provides a solution to the gate-induced drain leakage (GIDL) current in a semiconductor structure. The method includes forming a first trench with a first initial doped region at its bottom, oxidizing the first trench, forming a first oxide layer on the sidewalls of the first trench, and forming a second oxide layer at the bottom of the first trench. The first oxide layer's thickness is greater than the second oxide layer's thickness. The doping element of the first initial doped region prolongs the reduction rate, so that the oxidation rate of the first initial doped region is lower than the oxidation rate of the substrate, thereby forming the first oxide layer. The GIDL of the semiconductor structure can be reduced, the turn-on sensitivity of the semiconductor structure can be improved, and the yield of the semiconductor structure can be increased.

14 Claims, 10 Drawing Sheets

(51) Int. Cl.
  *H01L 21/762* (2006.01)
  *H01L 21/768* (2006.01)
  *H10B 12/00* (2023.01)
  *H10D 64/27* (2025.01)

(52) U.S. Cl.
  CPC .......... *H10B 12/01* (2023.02); *H10D 62/102* (2025.01); *H10D 64/513* (2025.01)

(58) Field of Classification Search
  CPC ......... H01L 21/02233; H01L 21/02252; H01L 21/0225; H01L 21/02258; H01L 21/76224; H10D 30/0289; H10D 30/0297; H10D 44/041; H10D 62/13; H10D 62/112; H10D 62/103; H10D 62/151; H10D 64/516; H10D 64/512; H10D 64/514; H01D 64/513
  See application file for complete search history.

(56) References Cited

FOREIGN PATENT DOCUMENTS

| | | |
|---|---|---|
| CN | 111063722 A | 4/2020 |
| CN | 112951827 A | 6/2021 |

* cited by examiner

SEMICONDUCTOR STRUCTURE AND METHOD OF MAKING THE SAME

CROSS REFERENCES TO RELATED APPLICATIONS

This application claims the benefit of priority of Chinese patent application with the application number 202210726492.7, entitled "Semiconductor Structure And Method of Making The Same", filed with the China National Intellectual Property Administration on Jun. 24, 2022, the contents of which are incorporated herein by reference in its entirety.

TECHNICAL FIELD

Embodiments of the present disclosure relate to the technical field of semiconductors, and in particular, to a semiconductor structure and a method for fabricating the same.

BACKGROUND

Dynamic random access memory is generally composed of multiple memory cells, each memory cell usually includes a capacitor and a transistor, the gate of the transistor is electrically connected to the word line (WL for short), and one of the source and drain of the transistor is connected to the bit line (BL for short) electrical connection. In order to improve the integration degree of the dynamic random access memory, a buried word line (BWL for short) is usually used in the related art, that is, the buried word line is formed in the substrate and intersects with the active area of the substrate, so that a partially buried word line is used for the gate of the transistor.

When forming a transistor, a gate trench is usually formed on the substrate, and then a gate oxide layer and a gate are formed in the gate trench. However, the above-mentioned semiconductor structure is prone to gate induced drain leakage current (short for GIDL) phenomenon, affecting the defect of low transistor turn-on sensitivity, and reducing the yield of semiconductor structures.

SUMMARY

In view of the above problems, embodiments of the present disclosure provide a semiconductor structure and a method for fabricating the same, which are used to improve the turn-on sensitivity of a transistor while reducing the gate-induced drain leakage current.

According to some embodiments, a first aspect of the embodiments of the present disclosure provides a method for fabricating a semiconductor structure, comprising:
 providing a substrate having a first trench therein;
 forming a first initial doped region at the bottom of the first trench;
 oxidizing the first trench, forming a first oxide layer on the sidewalls of the first trench, and forming a second oxide layer at the bottom of the first trench, and the thickness of the first oxide layer is greater than the thickness of the second oxide layer, and the oxidation rate of the first initial doped region is lower than the oxidation rate of the substrate.

In some embodiments, oxidizing the first trench includes: oxidizing the substrate of the sidewalls of the first trench to form the first oxide layer, and oxidizing a portion of the bottom of the first trench. The first initial doped region that is oxidized forms the second oxide layer, and the first initial doped region that is not oxidized forms a first doping region.

In some embodiments, oxidizing the first trench includes: oxidizing the substrate of the sidewalls of the first trench to form the first oxide layer, and oxidizing all the bottom of the first trench forms the second oxide layer.

In some embodiments, oxidizing the first trench includes: oxidizing the substrate of the sidewalls of the first trench to form the first oxide layer, and oxidizing all the bottom of the first trench and a portion of the substrate at the bottom of the first trench forms the second oxide layer.

In some embodiments, after forming the first initial doped region, depositing a first dielectric layer on the inner surface of the first trench.

The first trench is oxidized, and the thickness of the second oxide layer is greater than the deposited thickness of the first dielectric layer; the oxidation rate of the first initial doped region is smaller than the oxidation rate of the first dielectric layer.

In some embodiments, oxidizing the first trench includes: oxidizing the entire first dielectric layer and part of the substrate on the sidewalls of the first trench to form the first oxide layer, oxidizing all of the first dielectric layer and part of the first initial doped region on the bottom wall of the first trench forms the second oxide layer.

In some embodiments, the thickness of the first dielectric layer on the sidewalls of the first trench and the bottom of the first trench is the same.

In some embodiments, forming the first initial doped region at the bottom of the first trench includes:
 Any one or more of group III-V elements are implanted into the bottom of the first trench.

In some embodiments, the ion implantation energy is 1 KeV-3 KeV.

In some embodiments, the ratio of the thickness of the first oxide layer to the thickness of the second oxide layer is (1.5-4):1.

In some embodiments, oxidizing the first trench includes:
 The first trench is oxidized by an in-situ water vapor generation process.

In some embodiments, the preparation method further includes: forming a gate structure in the first trench after oxidizing the first trench.

In some embodiments, a top surface of the gate structure is lower than a top surface of the substrate, and an insulating layer is formed on the top surface of the gate structure.

In some embodiments, after the step of forming an insulating layer on the top surface of the gate structure, the preparation method further includes: forming a second doped region and a third doped region in the substrate, wherein the second doped region and the third doped region are located on both sides of the first trench.

The preparation method of the semiconductor structure provided by the embodiment of the present disclosure has the following advantages:

In the preparation method of the semiconductor structure provided by the embodiment of the present disclosure, by forming the first initial doped region at the bottom of the first trench, when the first trench is subsequently oxidized, the impurity element of the doping of the first initial doped region is will prolong the reduction rate of the first initial doped region, so that the oxidation rate of the first doped region is lower than the oxidation rate of the substrate, so that the thickness of the first oxide layer formed is greater than the thickness of the second oxide layer, so the gate-induced drain leakage (GIDL) of the semiconductor structure can be reduced, and the turn-on sensitivity of the semiconductor structure can be improved, thereby improving the yield of the semiconductor structure.

According to some embodiments, a second aspect of the embodiments of the present disclosure provides a semiconductor structure, which is manufactured by the method provided in the first aspect, and has the beneficial effects.

In addition to the technical problems solved by the embodiments of the present disclosure, the technical features, the technical solutions, and the beneficial effect described above, the embodiments of the present disclosure provides also the semiconductor structures made by the method. The technical features and the technical solution, with the beneficial effects will be described in further detail in the specific embodiments.

BRIEF DESCRIPTION OF THE DRAWINGS

In order to illustrate the embodiments of the present disclosure or the technical solutions in the prior art more clearly, the following briefly introduces the accompanying drawings used in the description of the embodiments or the existing art. Obviously, the accompanying drawings in the following description. These are some embodiments of the present disclosure, and for those of ordinary skill in the art, other drawings can also be obtained from these drawings without creative effort.

REFERENCE NUMBERS

10: substrate; 11: first trench; 13: second doping region; 14: third doping region; 20: first photoresist layer; 21: first shielding portion; 22: second opening; 30: first initial doped region; 40: first oxide layer; 50: second oxide layer; 60: first doped region; 70: first dielectric layer; 80: gate structure; 90: insulating layer; and 100: Barrier layer.

DETAILED DESCRIPTION OF THE PREFERRED EMBODIMENTS

As mentioned in the background art, semiconductor structures usually have the technical problems of Gate Induced Drain Leakage (GIDL) and low turn-on sensitivity of transistors. It has been found the cause of this problem: there is an oxide layer covered with a low step on the inner wall of the trench by the preparation process in standard processes, so it is difficult to form an oxide layer with a thin bottom and thick sidewalls.

In view of the above technical problems, embodiments of the present application provide a semiconductor structure and a method for fabricating the same. By forming a first initial doped region at the bottom of the first trench, when the first trench is subsequently oxidized, the first doping element in the initial doping region will prolong the reduction rate of the first initial doped region, so that the oxidation rate of the first doping region is lower than the oxidation rate of the substrate, so that the thickness of the first oxide layer formed is greater than that of the second oxide layer. The thickness of the layer can thus not only reduce the gate induced drain leakage (GIDL) of the semiconductor structure, but also improve the turn-on sensitivity of the semiconductor structure, thereby improving the yield of the semiconductor structure.

In order to make the above objects, features and advantages of the embodiments of the present disclosure more obvious and easy to understand, the technical solutions in the embodiments of the present disclosure will be clearly and completely described below with reference to the accompanying drawings in the embodiments of the present disclosure. Obviously, the described embodiments are only some, but not all, embodiments of the present disclosure. Based on the embodiments in the present disclosure, all other embodiments obtained by those of ordinary skill in the art without creative efforts shall fall within the protection scope of the present disclosure.

This embodiment does not limit the semiconductor structure. The following will take the semiconductor structure as a dynamic random access memory (DRAM) as an example for introduction, but this embodiment is not limited to this, and the semiconductor structure in this embodiment may also be other structures.

Figure 1:
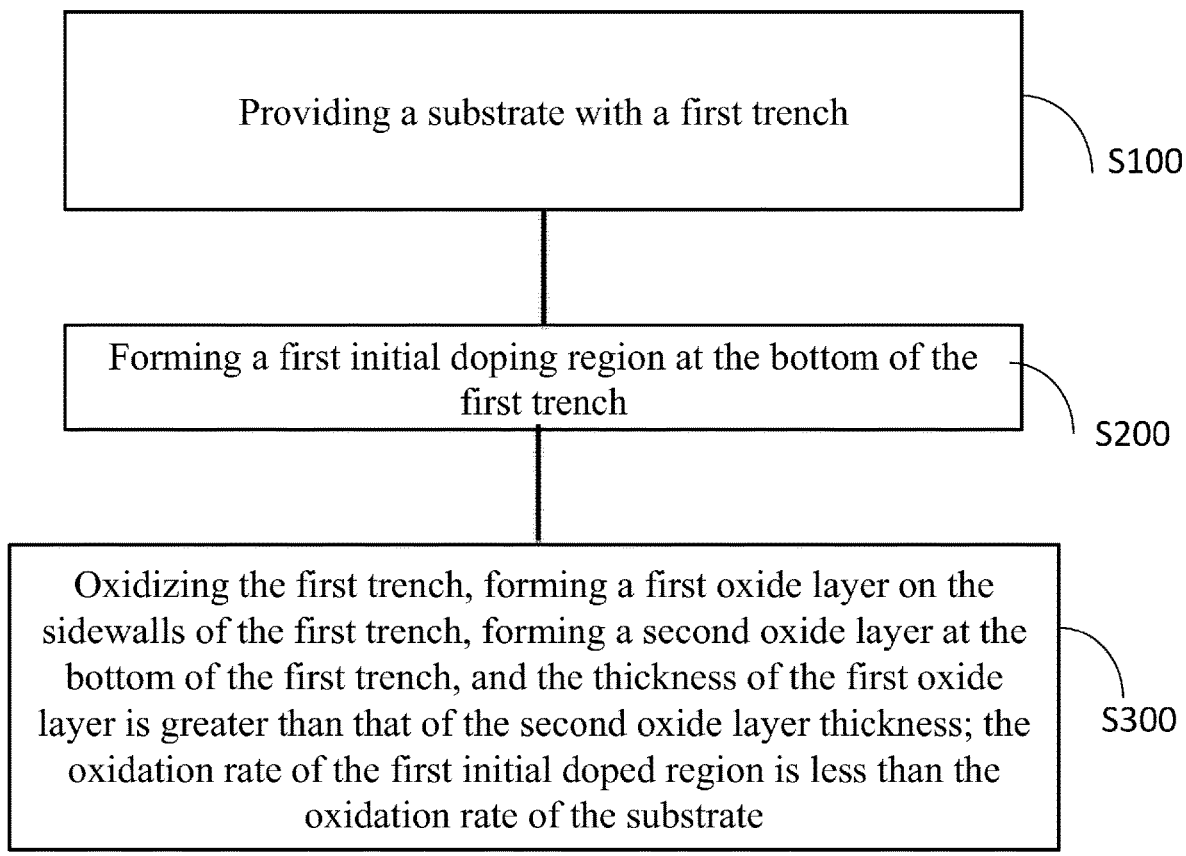
FIG. 1 is a process flow chart of a method for fabricating a semiconductor structure provided by an embodiment of the present disclosure.

Please refer to FIG. 1, a method for fabricating a semiconductor structure provided by an embodiment of the present invention includes the following steps:

Step S100: providing a substrate with a first trench in the substrate.

The substrate 10 may be made of a semiconductor material, and the semiconductor material may be one of silicon, germanium, silicon germanium, silicon carbide, silicon on insulator (SOI) or germanium on insulator (GOI). one or more.

The substrate 10 includes a plurality of active areas (AA for short), and the plurality of active areas are arranged at intervals. In some possible embodiments, a shallow trench isolation (STI for short) structure may be set between multiple active regions, and the multiple active regions are separated by the shallow trench isolation structure to ensure that each The active regions are independent of each other.

Exemplarily, a shallow trench is formed in the substrate through a patterning process, and an insulating material is filled in the shallow trench, so as to define a plurality of active regions separated by the shallow trench isolation structure on the substrate. The patterning process may be a Self-Aligned Double Patterning (SADP) process or a Self-Aligned Quadruple Patterning (SAQP) process. Herein, the insulating material may be silicon oxide.

The substrate 10 has first trenches 11, and the number of the first trenches 11 may be multiple, wherein some of the first trenches 11 are located on the shallow trench isolation structure, and some of the first trenches 11 are located on the shallow trench isolation structure. On the source region, for example, the first trench 11 on the active region can be a gate trench, and a gate is formed in the first trench 11 to form a buried gate structure.

In some possible implementations, only one first trench 11 passes through an active region, that is, the active region is divided into two parts, left and right, by the first trench 11, and one of the two parts is the first trench 11. The other contact area is the second contact area. For example, the left part is the first contact area, the first contact area is connected to the bit line, and the right part is the second contact area, and the second contact area is connected to the capacitor structure.

In some other possible implementations, two first trenches pass through one active region, that is, the active region is divided into three parts, left, middle and right by the trench, and the middle part among the three parts is one The contact area, the part located on both sides is a contact area. For example, the middle part is the first contact area, the first contact area is connected to the bit line, and the left and right parts are the second contact area, and the second contact area is connected to the capacitor. This arrangement facilitates the subsequent formation of two transistors in one active region, and enables the two transistors to share a source region or a drain region. In this way, the arrangement of the two transistors can be optimized and the occupied area is smaller. Furthermore, the integration degree of the semiconductor structure and the storage density of the semiconductor structure can be improved.

Figure 2:
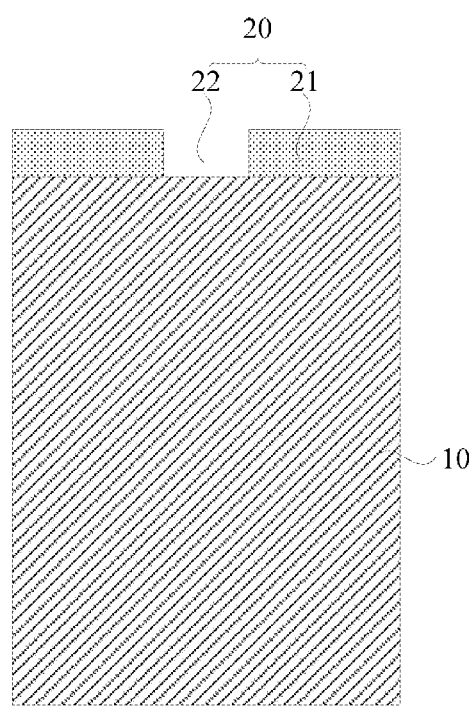
FIG. 2 is a schematic structural diagram after forming a first photoresist layer in a method for fabricating a semiconductor structure provided by an embodiment of the present disclosure.

Exemplarily, referring to FIG. 2, the first trench 11 may be performed by the following process: forming the first photoresist layer 20 on the substrate 10, that is, the top surface of the substrate 10 may be formed by coating a first photoresist layer 20.

The first photoresist layer 20 is patterned so that a plurality of first shielding portions 21 are formed on the first photoresist layer 20 at intervals, and first openings 22 are formed between adjacent first shielding portions, that is, by means of exposure and development, part of the first photoresist layer 20 is patterned, and the remaining first photoresist layer forms a plurality of first shielding portions 21.

After that, dry etching or wet etching is used to remove a part of the thickness of the substrate 10 exposed in the first opening 22 to form the first trench 11 in the substrate 10.

Figure 3:
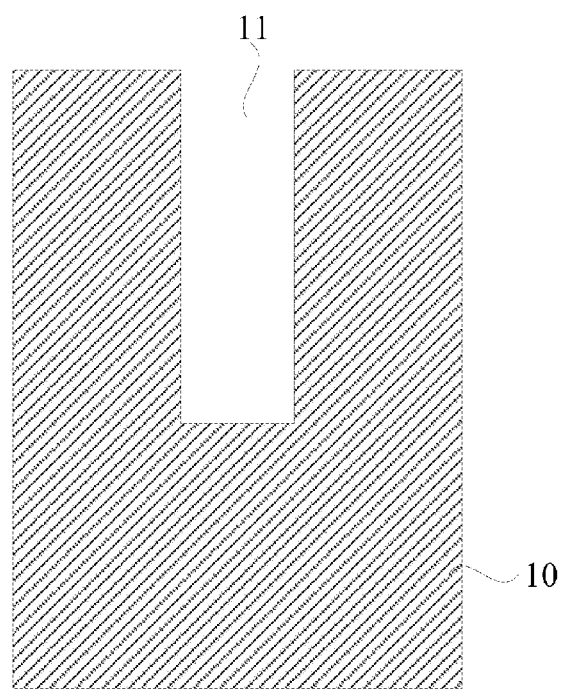
FIG. 3 is a schematic structural diagram after forming a first trench in a method for fabricating a semiconductor structure provided by an embodiment of the present disclosure.

It should be noted that when the number of the first trench 11 is multiple, the multiple first trenches 11 are arranged at intervals along the first direction. Exemplarily, there are one or two first trenches distributed in each active region. Wherein, the first direction may intersect with the extending direction of the active region. FIG. 3 only shows a schematic cross-sectional view of one first trench 11.

Step S200: forming a first initial doped region at the bottom of the first trench 11.

Figure 4:
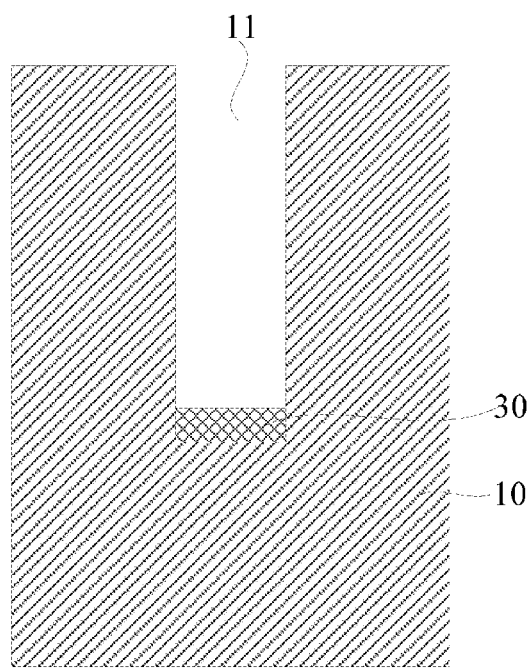
FIG. 4 is a schematic structural diagram after forming a first initial doped region in a method for fabricating a semiconductor structure provided by an embodiment of the present disclosure.

Referring to FIG. 4, in this embodiment, an ion diffusion process or a plasma doping process (Plasma doping system) can be used to form the first initial doped region 30 at the bottom of the first trench 11. For example, a dopant element may be implanted into the bottom of the first trench 11 using a plasma doping process, so that the dopant element reacts with the substrate 10 exposed at the bottom of the first trench 11 to form the first initial dopant District 30. Wherein, the doping element may be any one or more of group III-V elements, including but not limited to one or more combinations of C, N, P, B, Ge, and Ga.

In an example, when the doping element is any one of the five group elements. Exemplarily, the doping element may be N element, which reacts with Si element in the substrate 10 to form SIN or SION.

In another example, when there are multiple types of doping elements, the doping elements may be multiple elements in the same group of III-V group, or the doping elements may be elements in different groups of III-V group Various, illustratively, the doping elements may be C elements and N elements, which react with Si elements in the substrate 10 to form SICN.

In some possible implementations, if the implantation energy of the plasma doping process is less than 1 KeV, the thickness of the first initial doped region 30 will be too small, so that when the bottom of the first trench 11 is subsequently oxidized, it is difficult to The thickness relationship between the subsequently formed first oxide layer and the second oxide layer is guaranteed. If the implantation energy of the plasma doping process is greater than 3 KeV, the production cost will be increased. Therefore, the implantation energy of the plasma doping process in this embodiment is 1 KeV-3 KeV, and the thickness of the first initial doped region 30 is controlled to be in the range of 1 nm-3 nm, so as to better control the subsequent formation of the first oxide layer and the first oxide layer. The thickness of the oxide layer ensures the performance of the semiconductor structure, and in addition, it can prevent the formation of the first initial doped region 30 from being too thick, thereby reducing the production cost of preparing the semiconductor structure.

Step S300: oxidizing the first trench, forming a first oxide layer on the sidewalls of the first trench, forming a second oxide layer at the bottom of the first trench, and the thickness of the first oxide layer is greater than that of the second oxide layer thickness; the oxidation rate of the first initial doped region is less than the oxidation rate of the substrate. The process schematic diagram of the preparation method thereof can be referred to FIG. 5 to FIG. 7.

The first oxide layer 40 and the second oxide layer 50 may serve as gate oxide layers. Exemplarily, the first trench 11 is oxidized by an in-situ steam generation process (ISSG for short) to form a continuous first oxide layer 40 and a second oxide layer 50. The first oxide layer 40 and the second oxide layer 50 in a U-shaped structure and located on the inner surface of the first trench, wherein the first oxide layer 40 may be formed by consuming part of the thickness of the substrate 10 located on the sidewalls of the first trench 11, and the second oxide layer 50 may be formed from first initial doped region 30 that consumes at least part of the thickness of the bottom wall of first trench 11.

Figure 5:
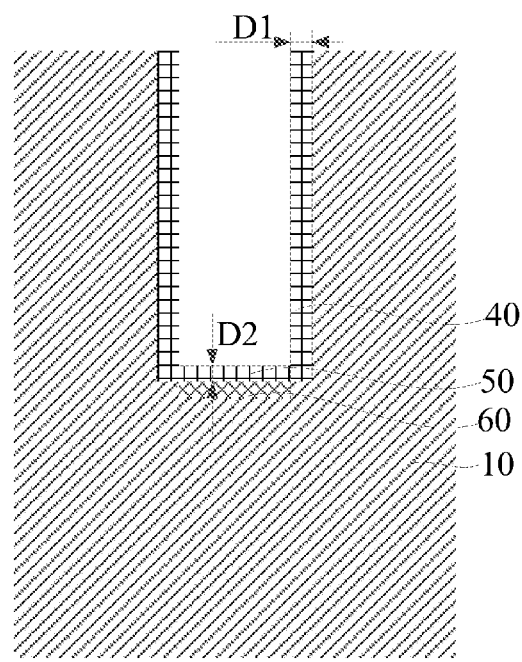
FIG. 5 is a first structural schematic diagram after forming a first oxide layer and a second oxide layer in the method for fabricating a semiconductor structure provided by an embodiment of the present disclosure.

It should be noted that, taking FIG. 5 as an example, the thickness of the first oxide layer 40 is D1 in FIG. 5, the thickness of the second oxide layer 50 is D2 in FIG. 5, and the thickness of the first trench sidewall portion of the substrate in 10 refers to the dimension along the direction perpendicular to the sidewalls of the first trench 11, which is D1 by taking FIG. 5 as an example.

In the in-situ water vapor generation process, the substrate 10 is heated and heated to a temperature high enough to catalyze the reaction between the oxygen-containing gas and the hydrogen-containing gas to form oxygen radicals, which can effectively oxidize silicon in the substrate 10 and silicon in the first initial doped region 30 to form the first oxide layer 40 and the second oxide layer 50, so that the first oxide layer 40 and the second oxide layer 50 can be formed in a relatively short time. The second oxide layer 50 can make the first oxide layer 40 and the second oxide layer 50 having better compactness, thereby making the formed semiconductor structure having better electrical properties.

In view of, when forming the second oxide layer 50, it is necessary to reduce the silicon in the first initial doped region 30 to radicals, and then react with oxygen radicals to form silicon oxides, but the doping elements in the initial doping region 30 will prolong the reduction rate of the first initial doped region 30, and therefore, the rate of forming silicon radicals is also slower, so that the oxidation rate of the first initial doped region 30 is lower than that of the substrate. The rate of oxidation, and further, makes the thickness of the first oxide layer 40 formed to be greater than the thickness of the second oxide layer 50. In this way, the formation of a gate oxide layer with thick sidewalls and thin bottoms can reduce the gate-induced drain leakage of the semiconductor structure. Current (GIDL for short) can also improve the turn-on sensitivity of the semiconductor structure, thereby improving the yield of the semiconductor structure.

Continuing to refer to FIG. 5, in a possible implementation manner, a part of the substrate 10 on the sidewalls of the first trench 11 is oxidized to form a first oxide layer 40, and a part of the thickness of the bottom of the first trench 11 is oxidized to a first initial doped region 30 forms a second oxide layer 50, and the unoxidized first initial doped region 30 forms a first doping region 60. For example, by controlling the reaction temperature and reaction time in the in-situ water vapor generation process, the oxidized thicknesses of the substrate 10 and the first initial doped region 30 can be controlled to form the first oxide layer 40 and the second oxide layer 50, respectively, make the thickness of the second oxide layer 50 thinner than the thickness of the first initial doped region 30, that is, the sum of the thickness of the second oxide layer 50 and the thickness of the first doping region 60 equals to the thickness of the first initial doped region 30.

Figure 6:
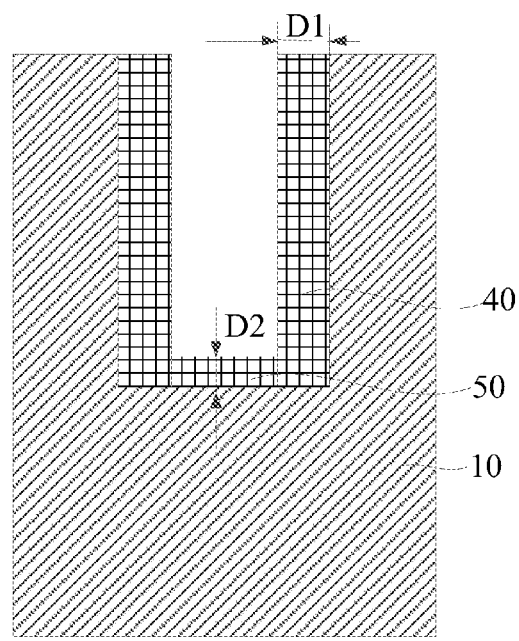
FIG. 6 is a second structural schematic diagram after forming a first oxide layer and a second oxide layer in the method for fabricating a semiconductor structure provided by an embodiment of the present disclosure.

Referring to FIG. 6, in a possible implementation manner, part of the substrate 10 on the sidewalls of the first trench 11 is oxidized to form a first oxide layer 40, and all the first initial doped regions 30 at the bottom of the first trench 11 are oxidized to form the second oxide layer 50.

Compared to only oxidizing part of the first initial doped region 30, the reaction time of the in-situ water vapor generation process can be increased in this embodiment, so that the first initial doped region 30 at the bottom of the first trench 11 is completely covered by the first initial doped region 30. Oxidation, so that the thickness of the second oxide layer 50 is equal to the thickness of the first initial doped region 30. It should be noted that in the same reaction time, the oxidation rate of the substrate 10 is greater than that of the first initial doped region 30. The thickness of the oxidized substrate 10 is greater than the thickness of the first initial doped region 30, so that the thickness of the first oxide layer 40 is greater than the thickness of the second oxide layer 50.

Figure 7:
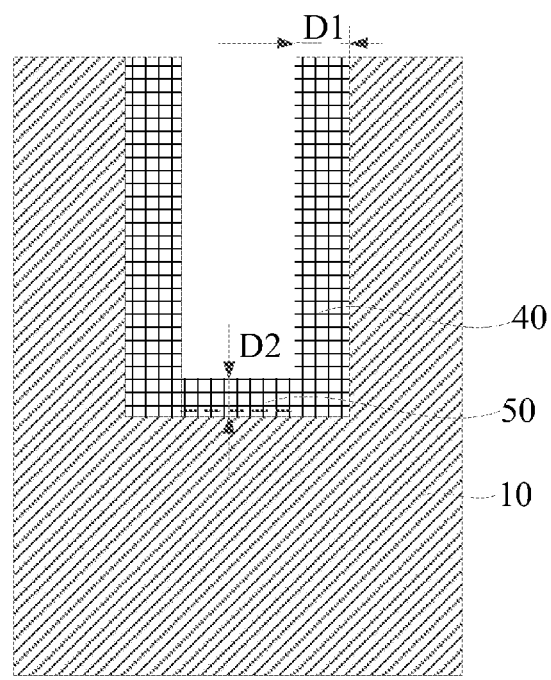
FIG. 7 is a third structural schematic diagram after forming a first oxide layer and a second oxide layer in the method for preparing a semiconductor structure provided by an embodiment of the present disclosure.

Referring to FIG. 7, in a possible implementation manner, the substrate 10 on the sidewalls of the first trench 11 is oxidized to form a first oxide layer 40, and all the first initial doped regions 30 and the bottom of the first trench 11 are oxidized. A portion of the substrate 10 at the bottom of the first trench 11 forms a second oxide layer 50, and the thickness of the first initial doped region 30 is smaller than the thickness of the second oxide layer 50.

Compared with the technical solution of oxidizing all the first initial doped regions 30, the present embodiment can continue to increase the reaction time of the in-situ water vapor generation process, so that all the first initial doped regions located at the bottom of the first trench 11 can be on the basis of the oxidation of 30, a part of the thickness of the substrate 10 located at the bottom of the first trench 11 is also oxidized, so that the thickness of the second oxide layer 50 is greater than the thickness of the first initial doped region 30. Taking the orientation shown in FIG. 7 as an example, the second oxide layer 50 below the dotted line is formed by consuming the substrate 10, and the second oxide layer 50 above the dotted line is formed by consuming the first initial doped region 30.

It should be noted that the thickness of the first oxide layer 40 is greater than that of the second oxide layer 50 because the oxidation rate of the substrate 10 is greater than that of the first initial doped region 30 within the same reaction time.

Figure 8:
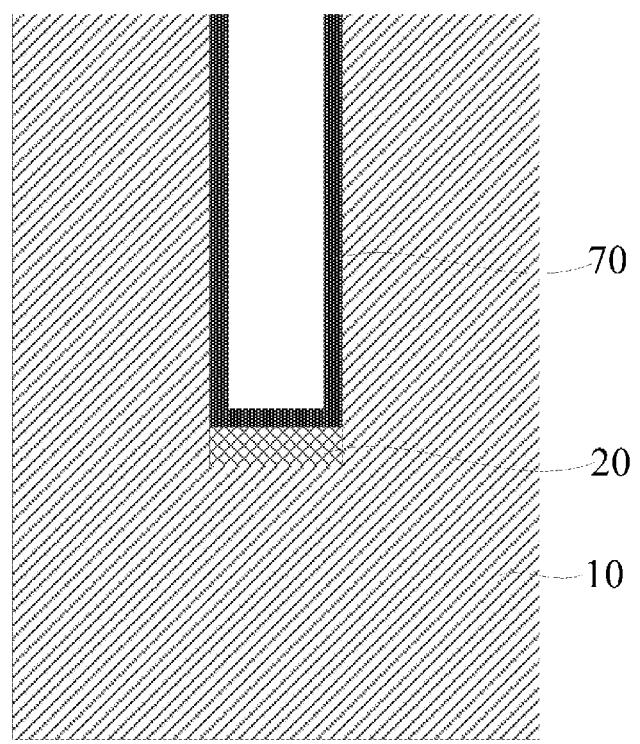
FIG. 8 is a schematic structural diagram after forming a first dielectric layer in a method for fabricating a semiconductor structure provided by an embodiment of the present disclosure.

Referring to FIG. 8, in some embodiments, after the step of forming the first preliminary doping region 30 at the bottom of the first trench 11, the method for fabricating the semiconductor structure further includes: depositing on the inner surface of the first trench 11 so a first dielectric layer 70 is formed.

In an example, the first dielectric layer 70 with uniform thickness may be formed on the sidewalls and bottom wall of the first trench 11 by an atomic layer deposition (ALD for short) process, and the formed first dielectric layer 70 has higher step coverage. For example, the thickness of the first dielectric layer 70 is 3-5 nm. In this example, the reaction temperature of the atomic layer deposition process can be adjusted, for example, the reaction temperature is 600° C.-700° C., so that the formation of the first dielectric layer 70 with high step coverage can be provided.

In another example, the first initial dielectric layer may be formed in the first trench 11 by chemical vapor deposition (CVD for short) or physical vapor deposition (PVD for short), and then the first initial dielectric layer is patterned as an initial dielectric layer, remove part of the first initial dielectric layer, and retain the first initial dielectric layer located on the sidewalls and bottom wall of the first trench 11 to form a first dielectric layer 70, the first dielectric layer 70 is in the first trenches 11 is surrounded by a second trench 12.

In an example, the first dielectric layer 70 may include silicide, such as silicon carbide or silicon germanium. It should be noted that the oxidation rate of the first initial doped region 30 is lower than the oxidation rate of the first dielectric layer 70, In the subsequent oxidation process, the first dielectric layer 70 is easier to be oxidized than the first initial doped region 30, so as to ensure the thickness relationship between the first oxide layer and the second oxide layer formed subsequently.

In another example, the material of the first dielectric layer 70 further includes silicon oxide, so that it is easier to form a relatively dense first oxide layer 40 by using the ISSG process subsequently to ensure the performance of the semiconductor structure.

The substrate 10 in the region between the adjacent first trenches 11 is used to form the source/drain regions. If the thickness of the substrate 10 consumed in the ISSG process is too large, it will lead to the remaining first trenches. The size of the substrate 10 between the trenches 11 is too small, which will increase the difficulty of preparing the source/drain regions. Based on this, in this embodiment, a uniform thickness is formed on the inner wall of the first trench 11. A dielectric layer 70 can protect the substrate 10. On the one hand, it can reduce the difficulty of preparing the source/drain regions. On the other hand, since the oxidation treatment of the inner surface of the first trench is performed on the first dielectric layer for the first oxidation treatment, in the oxidation treatment of the substrate or the first initial doped region, the thickness of the first oxide layer 40 on the sidewalls and the thickness of the second oxide layer 50 at the bottom can be regulated by controlling the thickness of the deposited first dielectric layer 70, so as to provide sufficient adjustment time for regulating the reaction temperature and reaction time in the ISSG process, so as to better control the thickness of the subsequent formation of the first oxide layer and the second oxide layer, which can reduce the gate induced drain leakage current (GIDL for short) of the semiconductor structure, also improve the turn-on sensitivity of the semiconductor structure, thereby increasing the yield of the semiconductor structure.

Figure 9:
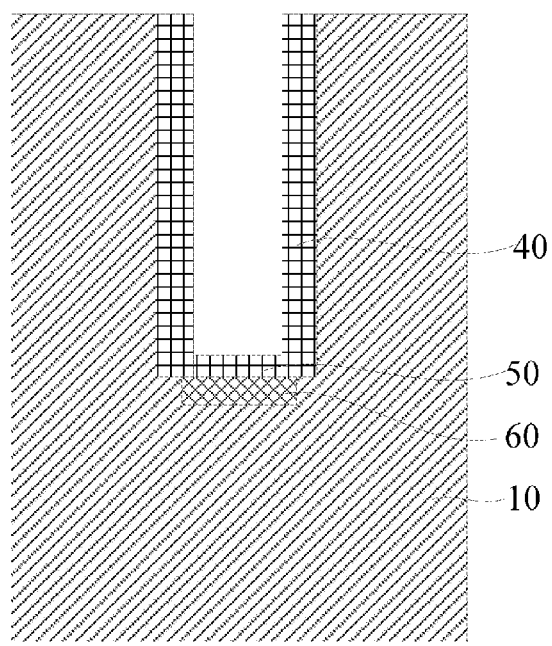
FIG. 9 is a fourth schematic structural diagram after the first oxide layer and the second oxide layer are formed in the method for fabricating the semiconductor structure provided by the embodiment of the present disclosure.

Referring to FIG. 9, after the first dielectric layer 70 is formed, the inner surface of the first trench 11 is oxidized to form a first oxide layer 40 and a second oxide layer 50, and the thickness of the second oxide layer 50 is greater than the deposition thickness of the first dielectric layer 70.

Exemplarily, the entire first dielectric layer 70 located on the sidewalls of the first trench 11 and the substrate 10 located on the sidewalls of the first trench 11 are oxidized to form the first oxide layer 40, and the second trench 12 is oxidized to form the first oxide layer 40. The entire first dielectric layer 70 on the bottom wall of the first trench 11 and part of the first initial doped region 30 on the bottom wall of the first trench 11 form the second oxide layer 50, wherein the thickness of the oxidized substrate 10 is greater than that of the oxidized substrate 10 the thickness of the first initial doped region 30 to ensure that the thickness of the finally formed first oxide layer 40 is greater than the thickness of the second oxide layer 50.

In this embodiment, by increasing the reaction time of the in-situ water vapor generation process, all the first initial doped regions 30 located at the bottom of the first dielectric layer 70 are oxidized. In this way, the thickness of the second oxide layer 50 is equal to the sum of the initial first the thickness of the initial doped region 30 and the thickness of the first dielectric layer 70, it should be noted that, within the same reaction time, since the oxidation rate of the substrate 10 is greater than the oxidation rate of the first initial doped region 30. The thickness of the oxidized substrate 10 is greater than the thickness of the first initial doped region 30, so that the thickness of the first oxide layer 40 is greater than that of the second oxide layer 50.

In some embodiments, the ratio of the thickness of the first oxide layer 40 to the thickness of the second oxide layer 50 is less than 1.5:1, which will cause the thickness of the first oxide layer 40 to be too small. Correspondingly, the thickness of the first oxide layer 40 The ability to store charges will decrease, and electrons or a small amount of carrier fluid generated by the subsequent formation of the gate structure will enter the drain through the first oxide layer 40, resulting in a high electric field effect in the drain, increasing the gate-induced drain leakage current. If the ratio of the thickness of the first oxide layer 40 to the second oxide layer 50 is greater than 4:1, then the thickness of the first oxide layer 40 is too large, and the thickness of the second oxide layer 50 will be increased accordingly, so that the Sensitivity of semiconductor structures.

Based on this, in this embodiment, the ratio of the thickness of the first oxide layer 40 to the thickness of the second oxide layer 50 is in a range of (1.5-4):1, so that the thickness of the first oxide layer 40 and the second oxide layer 50 can be adjusted reasonably. The thickness can not only reduce the gate-induced drain leakage (GIDL) of the semiconductor structure, but also improve the turn-on sensitivity of the semiconductor structure, thereby improving the yield of the semiconductor structure.

Figure 10:
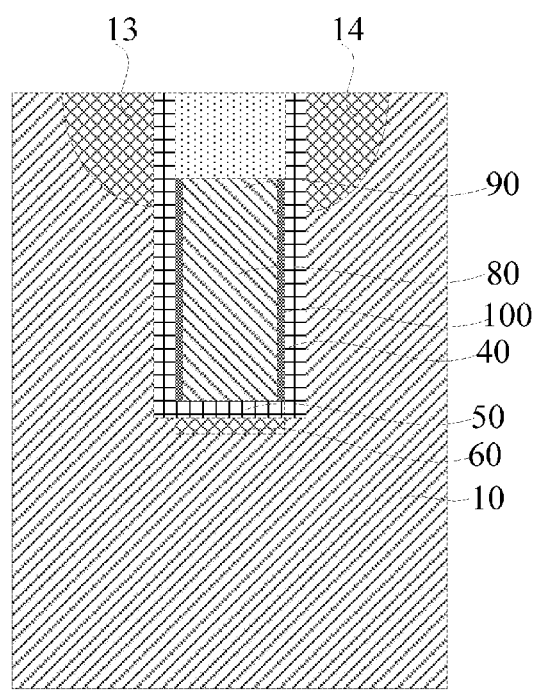
FIG. 10 is a schematic structural diagram after forming a gate structure and an insulating layer in a method for fabricating a semiconductor structure provided by an embodiment of the present disclosure.

Referring to FIG. 10, in some embodiments, the method for fabricating the semiconductor structure further includes: after the step of oxidizing the first trench, forming a gate structure 80 in the first trench 11, that is, forming a gate structure 80 in the first trench 11. The gate structure 80 is formed in the area surrounded by the oxide layer 40 and the second oxide layer 50.

Exemplarily, a deposition process may be used to deposit a conductive material in the area surrounded by the first oxide layer 40 and the second oxide layer 50, the conductive material fills the area surrounded by the first oxide layer 40 and the second oxide layer 50, and then, using an etching process to remove a certain thickness of conductive material, and the remaining conductive material constitutes the gate structure 80, so that the top surface of the gate structure 80 is lower than the top surface of the substrate 10. The conductive material may include tungsten or polysilicon.

It should be noted that, the gate structure 80 may have a single-layer structure, or may include a double-layer structure, which is not specifically limited in this embodiment.

After that, an insulating layer 90 is formed on the top surface of the gate structure by a deposition process. For example, the insulating layer 90 can be formed on the top surface of the gate structure 80 by a chemical vapor deposition process or a physical vapor deposition process, and the insulating layer 90 can be used to realize the subsequent insulation formation between other semiconductor devices (e.g., capacitor structures) on the substrate. The material of the insulating layer 90 includes silicon nitride, but is not limited thereto.

In some embodiments, before forming the gate structure 80 in the region surrounded by the first oxide layer 40 and the second oxide layer 50, the method for fabricating the semiconductor structure further includes: forming the first oxide layer 40 and the second oxide layer 50. A barrier layer 100 is formed thereon, and the top surface of the barrier layer 100 is lower than the top surface of the first oxide layer 40, that is, the top surface of the barrier layer 100 is lower than the top surface of the substrate 10. In this way, the barrier layer 100 can be used to block subsequent formation. The conductive material in the gate structure diffuses toward the substrate to improve the performance of the semiconductor structure.

The material of the barrier layer 100 includes titanium nitride, but is not limited thereto.

In some embodiments, after the step of forming the insulating layer on the top surface of the gate structure, the method for fabricating the semiconductor structure further includes: forming a second doping region 13 and a third doping region 14 in the substrate 10. The second doped region 13 and the third doped region 14 are located on both sides of the first trench 11, so that the second doped region 13 and the third doped region 14 are electrically connected with the subsequent formation of the capacitor structure or the bit line structure. Exemplarily, a second photoresist layer (not shown in the figures) having a second opening may be formed on the substrate 10, and the second opening is used to expose partial regions on both sides of the first trench, and then, doping ions are implanted into the exposed regions by using an ion diffusion process or a plasma doping process to form a second doping region 13 and a third doping region 14 in the substrate 10, wherein the second doping region 13 and the third doping region 14 are formed in the substrate 10. One of the doped region 13 and the third doped region 14 serves as a source region, and the other serves as a drain region.

In this embodiment, the types of doping ions in the second doping region 13 and the third doping region 14 may be P-type ions or N-type ions.

Embodiments of the present disclosure further provide a semiconductor structure, which is manufactured by the method for fabricating the semiconductor structure in the above-mentioned embodiments, so the semiconductor structure has the beneficial effects in the above-mentioned embodiments, details of the embodiments will not be repeated here.

The embodiments or implementations in this specification are described in a progressive manner, and each embodiment focuses on the differences from other embodiments, and the same and similar parts between the various embodiments may be referred to each other.

In the description of this specification, reference to the terms "one embodiment," "some embodiments," "exemplary embodiment," "example," "specific example," or "some examples," or the like, is meant to incorporate embodiments. A particular feature, structure, material, or characteristic described or exemplified is included in at least one embodiment or example of the present disclosure.

In this specification, schematic representations of the above terms do not necessarily refer to the same embodiment or same examples. Furthermore, the particular features, structures, materials or characteristics described may be combined in any suitable manner in any one or more embodiments or examples.

Finally, it should be noted that the above embodiments are only used to illustrate the technical solutions of the present disclosure, but not to limit them; although the present disclosure has been described in detail with reference to the foregoing embodiments, those of ordinary skill in the art should understand that: the technical solutions described in the foregoing embodiments can still be modified, or some or all of the technical features thereof can be equivalently replaced; and these modifications or replacements do not make the essence of the corresponding technical contents deviate from the scope in the present disclosure.

The invention claimed is:

1. A method for fabricating a semiconductor structure, comprising steps of:
providing a substrate having a first trench;
forming a first initial doped region at a bottom of the first trench;
forming a first oxide layer on sidewalls of the first trench by oxidizing the first trench; and
forming a second oxide layer at the bottom of the first trench, wherein a thickness of the first oxide layer is greater than a thickness of the second oxide layer, and wherein an oxidation rate of the first initial doped region is lower than an oxidation rate of the substrate.

2. The method for fabricating the semiconductor structure according to claim 1, wherein oxidizing the first trench comprises: oxidizing the sidewalls of the first trench to form the first oxide layer, and oxidizing a part of a thickness in the first initial doped region at the bottom of the first trench to form the second oxide layer, wherein an unoxidized part in the first initial doped region forms a first doping region.

3. The method for fabricating the semiconductor structure according to claim 1, wherein oxidizing the first trench comprises: oxidizing the sidewalls of the first trench to form the first oxide layer, and oxidizing all of the first initial doped region at the bottom of the first trench form the second oxide layer.

4. The method for fabricating the semiconductor structure according to claim 3, wherein oxidizing the first trench further comprises: oxidizing the sidewalls of the first trench to form the first oxide layer, and oxidizing all of the first initial doped region at the bottom of the first trench and a part of the substrate at the bottom of the first trench to form the second oxide layer.

5. The method for fabricating the semiconductor structure according to claim 1, wherein after forming the first initial doped region, depositing a first dielectric layer on an inner surface of the first trench located in an active region;
wherein the inner surface of the first trench is oxidized, wherein the thickness of the second oxide layer is greater than a thickness of the first dielectric layer; and
wherein the oxidation rate of the first initial doped region is smaller than an oxidation rate of the first dielectric layer.

6. The method for fabricating the semiconductor structure according to claim 5, wherein oxidizing the first trench comprises: oxidizing all of the first dielectric layer on the sidewalls of the first trench and a part of the substrate to form the first oxide layer, and oxidizing all of the first dielectric layer on the bottom of the first trench and a part of the first initial doped region to form the second oxide layer.

7. The method for fabricating the semiconductor structure according to claim 5, wherein a thickness of the first dielectric layer on the sidewalls of the first trench is same as a thickness of the first dielectric layer on the bottom of the first trench.

8. The method for fabricating the semiconductor structure according to claim 1, wherein forming the first initial doped region at the bottom of the first trench comprises:
implanting into the bottom of the first trench one or more of group III-V elements.

9. The method for fabricating the semiconductor structure according to claim 8, wherein an energy of the implanting is in a range of 1KeV-3KeV.

10. The method for fabricating the semiconductor structure according to any one of claim 1, wherein a ratio of the thickness of the first oxide layer to the thickness of the second oxide layer is in a range of (1.5-4):1.

11. The method for fabricating the semiconductor structure according to any one of claim 1, wherein an in-situ water vapor generation process is applied to oxidize the first trench.

12. The method for fabricating the semiconductor structure according to any one of claim 1, wherein the method further comprises forming a gate structure in the first trench after oxidizing the first trench.

13. The method for fabricating the semiconductor structure according to claim 12, wherein:
a top surface of the gate structure is lower than a top surface of the substrate, and wherein an insulating layer is formed on the top surface of the gate structure.

14. The method for fabricating the semiconductor structure according to claim 13, wherein after the insulating layer is formed on the top surface of the gate structure, the method further comprises:

forming a second doped region and a third doped region in the substrate, wherein the second doped region and the third doped region are disposed on both sides of the first trench.

* * * * *